United States Patent

Lin et al.

[11] Patent Number: 6,043,719
[45] Date of Patent: Mar. 28, 2000

[54] LOW-VOLTAGE, LOW-JITTER VOLTAGE CONTROLLED OSCILLATOR

[75] Inventors: Jyhfong Lin, Taipei; Shan-Shan Lee, Kaohsiung Hsien; Yuwen Swei, Taipei, all of Taiwan

[73] Assignee: VIA Technologies, Inc., Hsin-Tien, Taiwan

[21] Appl. No.: 09/270,028

[22] Filed: Mar. 16, 1999

[30] Foreign Application Priority Data

Oct. 21, 1998 [TW] Taiwan .................................. 87117425

[51] Int. Cl.$^7$ ...................................................... H03B 27/00
[52] U.S. Cl. ............................. 331/57; 327/280; 327/266
[58] Field of Search ............................... 331/57; 327/266, 327/272, 264, 287, 280, 209, 210, 281, 208

[56] References Cited

U.S. PATENT DOCUMENTS

5,475,344  12/1995  Maneatis et al. ......................... 331/57

*Primary Examiner*—Benny Lee
*Assistant Examiner*—Kimberly Glenn
*Attorney, Agent, or Firm*—J. C. Patents; Jiawei Huang

[57] ABSTRACT

A low-voltage, low-jitter voltage controlled oscillator according to the invention includes a plurality of delay units electrically connected in series to form a closed loop circuit. Each delay unit has a symmetric differential structure constituted by a plurality of MOS FETs. Furthermore, only two transistors are stacked between the power source and ground. Thus, the low-voltage, low-jitter voltage controlled oscillator can operate at low voltage, and can not be affected by the variation of the power source voltage.

11 Claims, 6 Drawing Sheets

LOW-VOLTAGE, LOW-JITTER VOLTAGE CONTROLLED OSCILLATOR

CROSS-REFERENCE TO RELATED APPLICATION

This application claims the priority benefit of Taiwan application serial no. 87117425, filed Oct. 21, 1998, the full disclosure of which is incorporated herein by reference.

BACKGROUND OF THE INVENTION

1. Field of the Invention

The invention relates to a voltage controlled oscillator, and more particularly to a low-voltage, low jitter voltage controlled oscillator.

2. Description of the Related Art

Due to the great progress of the semiconductor technology, the operating speed of contemporary computers is getting increasingly faster. However, the increase of the operating speed results in more power consumption. To efficiently reduce the power consumption, the operating voltage of contemporary computers is gradually lowered from 5V to 2.5V, even to less than 2.0V. In coordination with the decrease of the operating voltage, a large number of circuits must be further modified to allow themselves to work at low-voltage condition, for example, an oscillator for providing a clock signal. Furthermore, clock signals used in current computer system have different frequencies. Most of the clock signals with different frequencies are proportionally generated based on a reference clock signal by a phase-locked loop circuit for the use of a number of subsystems. A voltage controlled oscillator in the computer system is one of the main factors to affect the performance of the phase-locked loop circuit. Additionally, the performance of the voltage controlled oscillator can be estimated based on long-term jitter, short-term jitter and influences caused by the variation of the power supply voltage.

Figure 1:
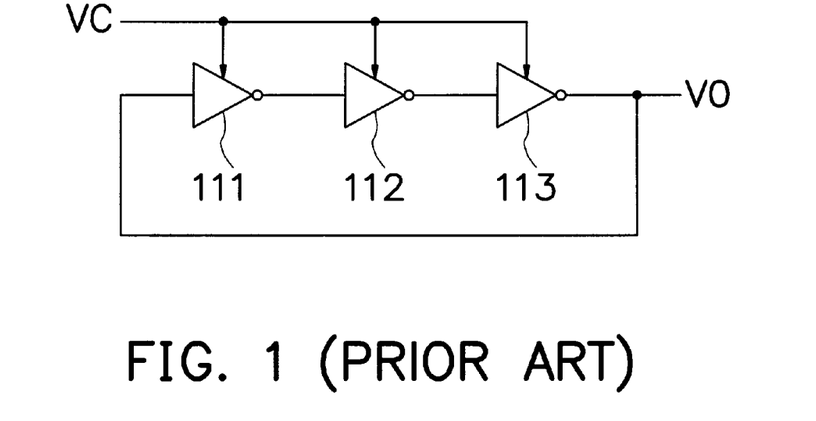
FIG. 1 is a circuit diagram illustrating a general voltage controlled oscillator.

FIG. 1 is a circuit diagram illustrating a conventional voltage controlled oscillator.

Referring to FIG. 1, the conventional voltage controlled oscillator is a closed loop circuit, and includes 3 inverters 111, 112 and 113 electrically connected in series. A control voltage VC is used to control each inverter to determine a signal delay time between the input terminal and the output terminal thereof. Thus, the frequency of a generated output signal VO can be determined by controlling the delay time.

Figure 2:
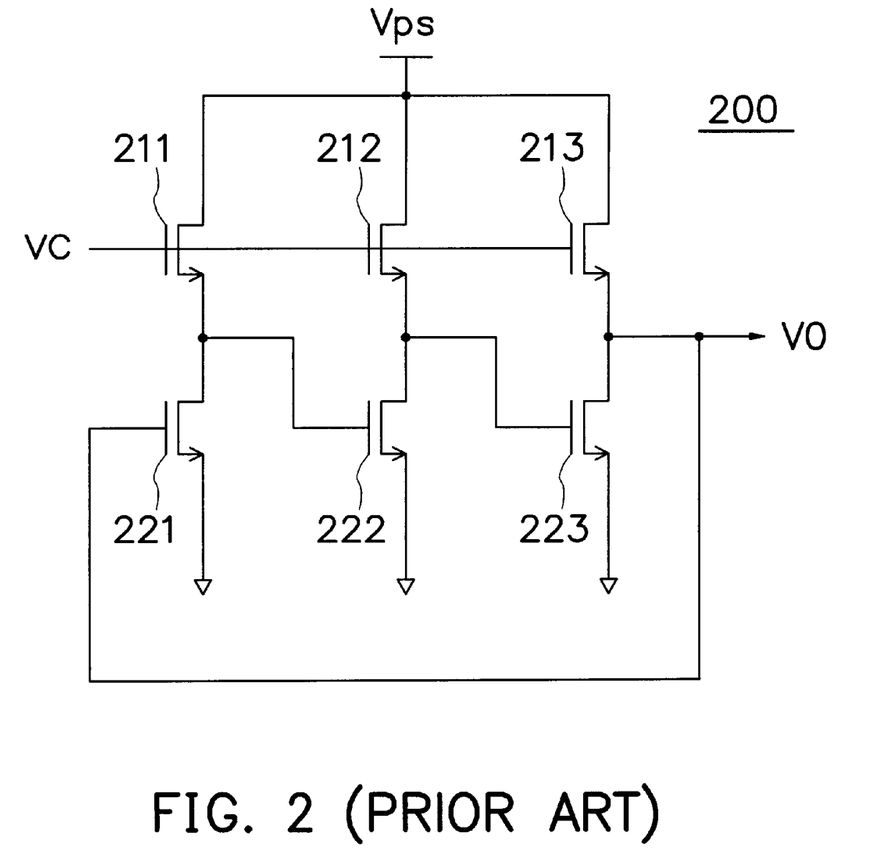
FIG. 2 is a circuit diagram illustrating a conventional voltage controlled oscillator consisting of MOS FETs.

FIG. 2 is a circuit diagram illustrating a conventional voltage controlled oscillator 200 consisting of MOS FETs.

As shown in FIG. 2, the voltage controlled oscillator 200 is a closed loop circuit consisting of 3 inverters which are constituted by MOS FETs 211, 221, MOS FETs 212, 222 and MOS FETs 213, 223, respectively. A control voltage VC is input to the gates of the MOS FETs 211, 212 and 213 for controlling the response time of each inverter, thereby determining the frequency of the output signal VO of the closed loop circuit.

As described above, the frequency of the output signal VO generated by voltage controlled oscillator 200 can be controlled by control voltage VC. However, the characteristics of the voltage controlled oscillator are easily affected by the variation of a power source Vps to vary the frequency of the output signal because each inverter consists of only two MOS FETs.

Figure 3:
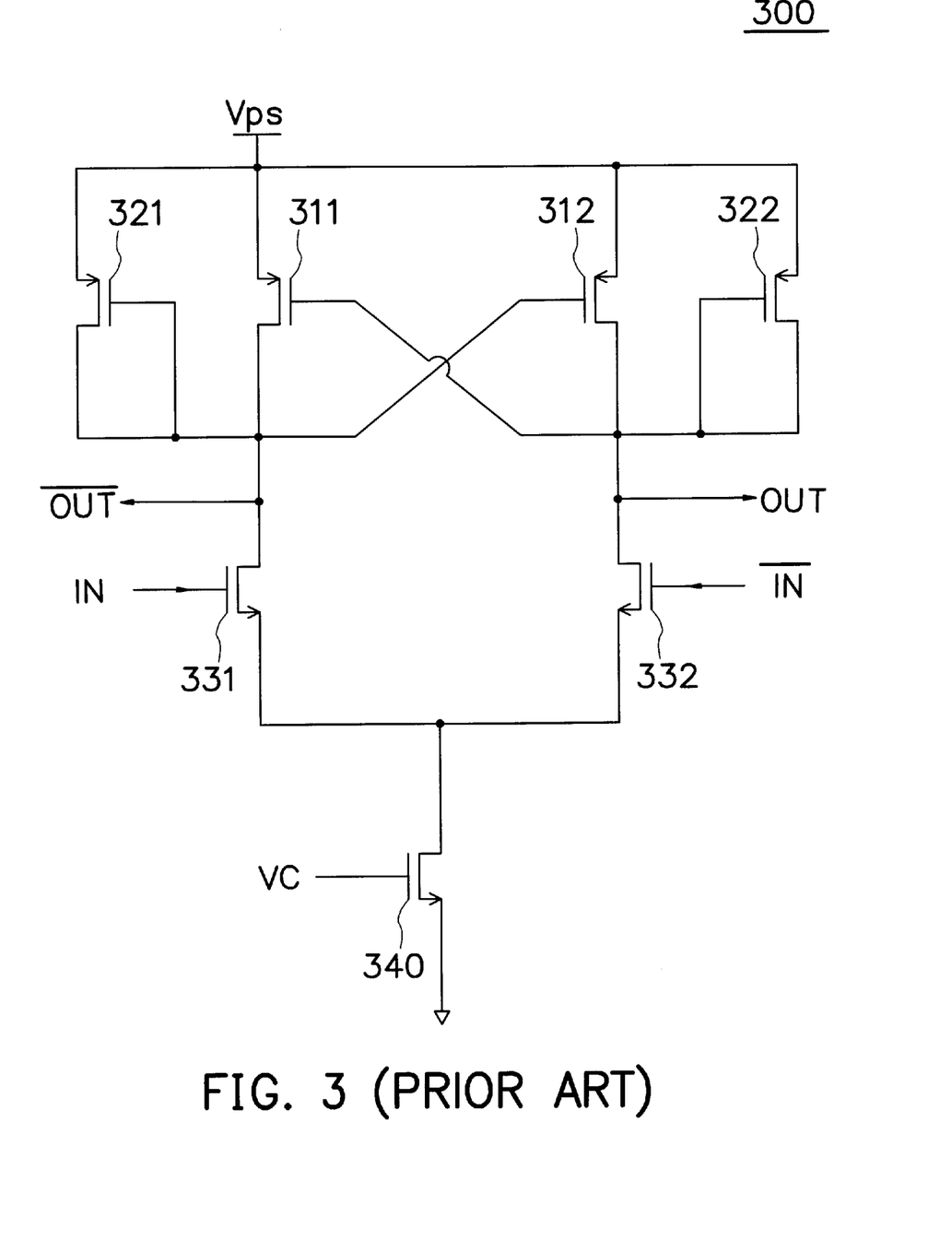
FIG. 3 is a circuit diagram illustrating a delay unit of another conventional voltage controlled oscillator.

FIG. 3 is a circuit diagram illustrating a delay unit 300 of another conventional voltage controlled oscillator. Similarly, the conventional voltage controlled oscillator is also a closed loop circuit consisting of 3 inverters.

Compared to the prior inverter having only one input terminal and one output terminal, the delay unit 300 shown in FIG. 3 has not only an input terminal IN and an output terminal OUT, but also a complementary input terminal $\overline{\text{IN}}$ and a complementary output terminal $\overline{\text{OUT}}$ for reducing sensitivity to the variation of power source Vps. In delay unit 300, MOS FETs 311 and 312 constitutes a latch circuit MOS FETs 321 and 322 connected in the form of a diode serve as active load devices. MOS FETs 331 and 332 are used for differential inputs, wherein the gates thereof serve as an input terminal IN and a complementary input terminal $\overline{\text{IN}}$. A MOS FET 340 is controlled by a control voltage VC to provide a drain current (current source) directly proportional to the control voltage VC, thereby determining the delay time of the delay unit. Therefore, the frequency of an oscillating signal generated by a closed loop circuit consisting of multiple delay units can be controlled by the control voltage.

Although the voltage controlled oscillator consisting of the delay units 300 has a better performance, 3 layers of MOS FETs stacked on each other between the power source Vps and ground need a higher operating voltage. The drain current of each MOS FET can be given by:

$$I_D = \frac{\mu_0 \varepsilon_0}{2 t_{0x}} \frac{W}{L} (V_{gs} - V_m)(1 + \lambda V_{DS})$$

The lowest operating voltage required by delay unit 300 is $2V_t + 3\Delta V$, wherein $\Delta V = V_{gs} - V_m$.

As can be seen from the above, a required operation voltage must be greater than 2.7V, if $\Delta V = 0.3V$, and $V_t = 0.9V$. However, since the power source of a current computer system can be as low as 2.5V, even less than 2.0V, the delay unit 300 can not normally operate in this case.

Accordingly, the prior art has the following disadvantages:

1. The first conventional voltage controlled oscillator has a simple structure, but the frequency of an generated oscillating signal is easily affected by the variation of the power source.

2. The second conventional voltage controlled oscillator has a better performance. However, it needs a higher operating voltage such that it can not meet the requirements of a computer system that uses a lower power source voltage.

SUMMARY OF THE INVENTION

In view of the above, an objective of the invention is to provide a low-voltage, low-jitter voltage controlled oscillator.

In order to achieve the above-stated objective, a low-voltage, low-jitter voltage controlled oscillator which receives a control voltage and generates an output signal and a complementary output signal with a frequency proportional to the control voltage is presented. The voltage controlled oscillator comprises:

A first delay unit, a second delay unit and a third delay unit each having an input terminal, a complementary input terminal, an output terminal, a complementary output terminal and a voltage control terminal, the input terminal and the complementary input terminal of the first delay unit electrically connected to the complementary output terminal and the output terminal of the third delay unit, the input terminal and the complementary input terminal of the second delay unit electrically connected to the complementary output terminal and the output terminal of the first delay unit, the input terminal and the complementary input terminal of the third delay unit electrically connected to the complementary output terminal and the output terminal of the second delay unit, the output signal and the complementary output signal output from the output terminal and the complementary output terminal of the third delay unit, the control voltage applied to the voltage control terminal of each delay unit to control the delay time between the input and the complementary input terminals, and the output and the complementary output terminals of each delay unit.

Each delay unit comprises a first MOS FET, a second MOS FET, a first load device, a second load device, a third MOS FET, a fourth MOS FET, a first current source and a second current source.

The sources of the first MOS FET and the second MOS FET are electrically connected to a power source. The gate of the second MOS FET is electrically connected to the drain of the first MOS FET. The drain of the second MOS FET is electrically connected to the gate of the first MOS FET.

Both terminals of the first load device are electrically connected to the source and the drain of the first MOS FET, respectively.

Both terminals of the second load device are electrically connected to the source and the drain of the second MOS FET, respectively.

The third MOS FET has a source electrically connected to the power source, a drain electrically connected to the drain of the first MOS FET, and a gate serving as the input terminal of each delay unit.

The fourth MOS FET has a source electrically connected to the power source, a drain electrically connected to the drain of the second MOS FET, and a gate serving as the complementary input terminal of each delay unit.

The first current source has a first terminal, a second terminal and a control terminal for generating a current proportional to the control voltage between the first terminal and the second terminal. The first terminal is electrically connected to the drain of the first MOS FET. The second terminal is electrically connected to ground. The control terminal serves as the voltage control terminal for receiving the control voltage.

The second current source has a first terminal, a second terminal and a control terminal for generating a current proportional to the control voltage between the first terminal and the second terminal. The first terminal is electrically connected to the drain of the second MOS FET. The second terminal is electrically connected to ground. The control terminal serves as the voltage control terminal for receiving the control voltage.

According to an embodiment of the invention, the first load device is a MOS FET of which the gate is electrically connected to its own drain, the source is electrically connected to the power source, and the drain is electrically connected to the drain of the first MOS FET. The second load device is a MOS FET of which the gate is electrically connected to its own drain, the source is electrically connected to the power source, and the drain is electrically connected to the drain of the second MOS FET.

Moreover, the first current source is a MOS FET of which the gate serves as the control terminal, the drain is electrically connected to the drain of the first MOS FET, and the source is electrically connected to ground. Similarly, the second current source is a MOS FET of which the gate serves as the control terminal, the drain is electrically connected to the drain of the second MOS FET, and the source is electrically connected to ground.

Alternatively, the first current source consists of a fifth MOS FET and a sixth MOS FET. The fifth MOS FET has a drain electrically connected to the drain of the first MOS FET and a gate electrically connected to a fixed bias voltage. The sixth MOS FET has a source electrically connected to ground, a drain electrically connected to the source of the fifth MOS FET, and a gate serving as the control gate. Similarly, the second current source consists of a seventh MOS FET and an eighth MOS FET. The seventh MOS FET has a drain electrically connected to the drain of the second MOS FET, and a gate electrically connected to a fixed bias voltage. The eighth MOS FET has a source electrically connected to ground, a drain electrically connected to the source of the seventh MOS FET, and a gate serving as the control terminal.

BRIEF DESCRIPTION OF THE DRAWINGS

The invention will become more understandable from the detailed description given below and the accompanying drawings, wherein.

DETAILED DESCRIPTION OF THE PREFERRED EMBODIMENT

Figure 4:
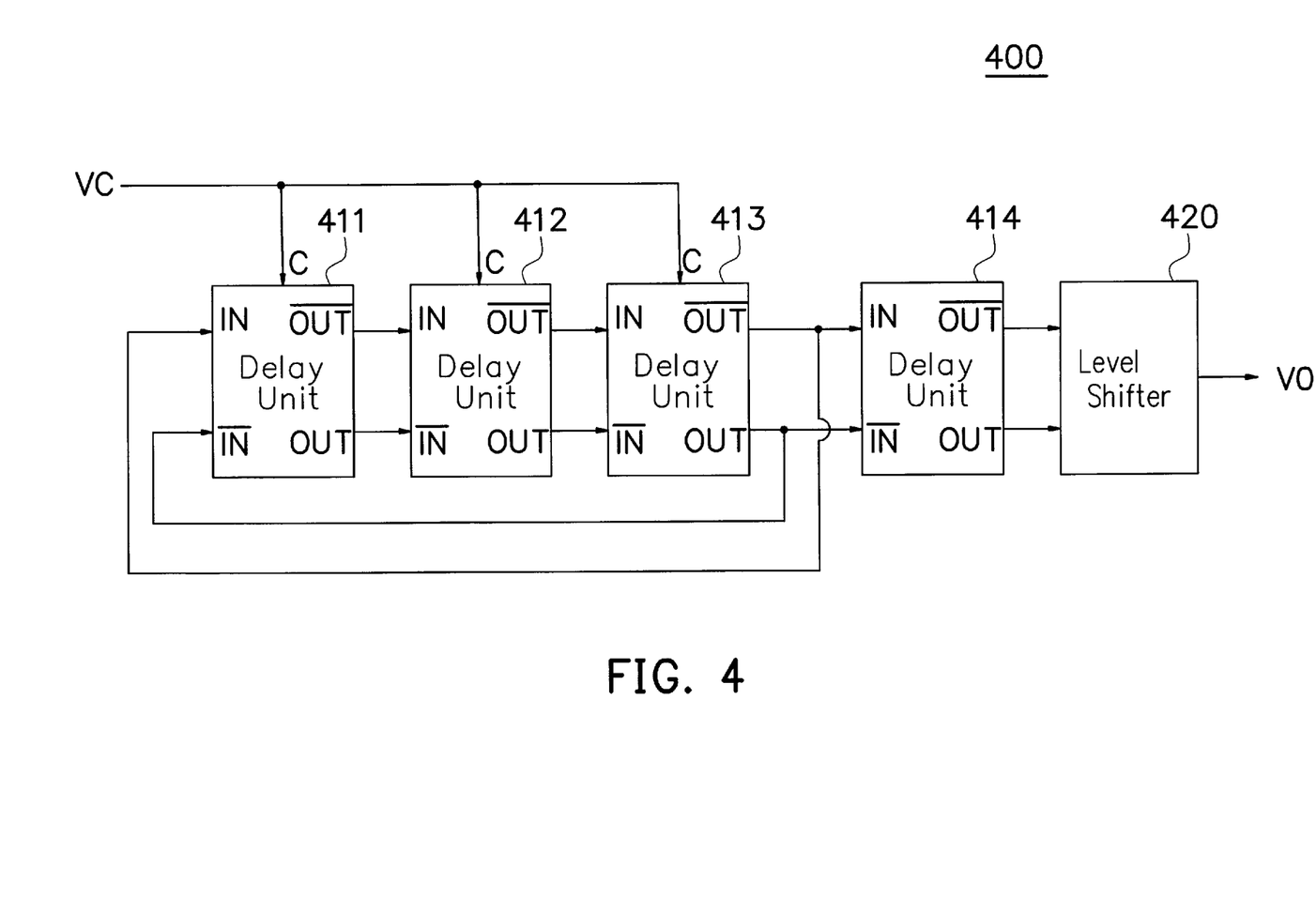
FIG. 4 is a block circuit diagram illustrating a voltage controlled oscillator according to the invention.

FIG. 4 is a block circuit diagram illustrating a voltage controlled oscillator 400 according to the invention. As shown in FIG. 4, the voltage controlled oscillator 400 is controlled by a control voltage VC to generate an output signal VO with a frequency proportional to the control voltage.

The voltage controlled oscillator 400 includes not only delay units 411, 412 and 413 forming a closed loop circuit, but also a delay unit 414 and a level shifter 420 following the delay unit 413. The delay unit 414 can prevent the output signal VO from kick-back to the closed loop circuit (including the delay units 411, 412 and 413) to shift the oscillation frequency. The level shifter 420 is used to convert a differential signal output from the delay unit 414 to the single ended output signal VO.

Each of the delay units 411, 412 and 413 with the same circuit structure and characteristics has an input terminal IN, a complementary input terminal $\overline{\text{IN}}$, an output terminal OUT, a complementary output terminal $\overline{\text{OUT}}$ and a voltage control terminal VC. The signal state of the input terminal IN is complementary to that of the complementary input terminal $\overline{\text{IN}}$ while the signal state of the output terminal OUT is complementary to that of the complementary output terminal $\overline{\text{OUT}}$. In addition, during a stable state of each delay unit, the signal state of the input terminal IN is opposite to that of the complementary output terminal $\overline{\text{OUT}}$. For example, when the input terminal IN is at high potential, the complementary output terminal $\overline{\text{OUT}}$ is at low potential, and vice versa. Similarly, the signal state of the complementary input terminal $\overline{\text{IN}}$ is also opposite to that of the output terminal OUT. The signal state at the output terminal of each delay unit is changed following the change of the signal state at the input terminal. The change rate of the signal state at the output terminal is determined by the potential at the voltage control terminal. Therefore, the delay time between the input terminal and the output terminal can be controlled.

The way to connect delay units 411, 412 and 413 in series is described as follows. The output terminal OUT and the complementary output terminal $\overline{\text{OUT}}$ of delay unit 411 are electrically connected to the complementary input terminal $\overline{\text{IN}}$ and the input terminal IN of delay unit 412, respectively. The output terminal OUT and the complementary output terminal $\overline{\text{OUT}}$ of delay unit 412 are electrically connected to the complementary input terminal $\overline{\text{IN}}$ and the input terminal IN of delay unit 413, respectively. The output terminal OUT and the complementary output terminal $\overline{\text{OUT}}$ of delay unit 413 are electrically connected to the complementary input port $\overline{\text{IN}}$ and the input port IN of delay unit 411. As can be obviously seen from the above, delay units 411, 412 and 413 are electrically connected in series to form a closed loop oscillating circuit. Moreover, a control voltage VC is input to the voltage control terminal of each delay unit to control the delay time between the input and the complementary input terminals IN, $\overline{\text{IN}}$ and the output and the complementary output terminals OUT, $\overline{\text{OUT}}$.

Figure 5:
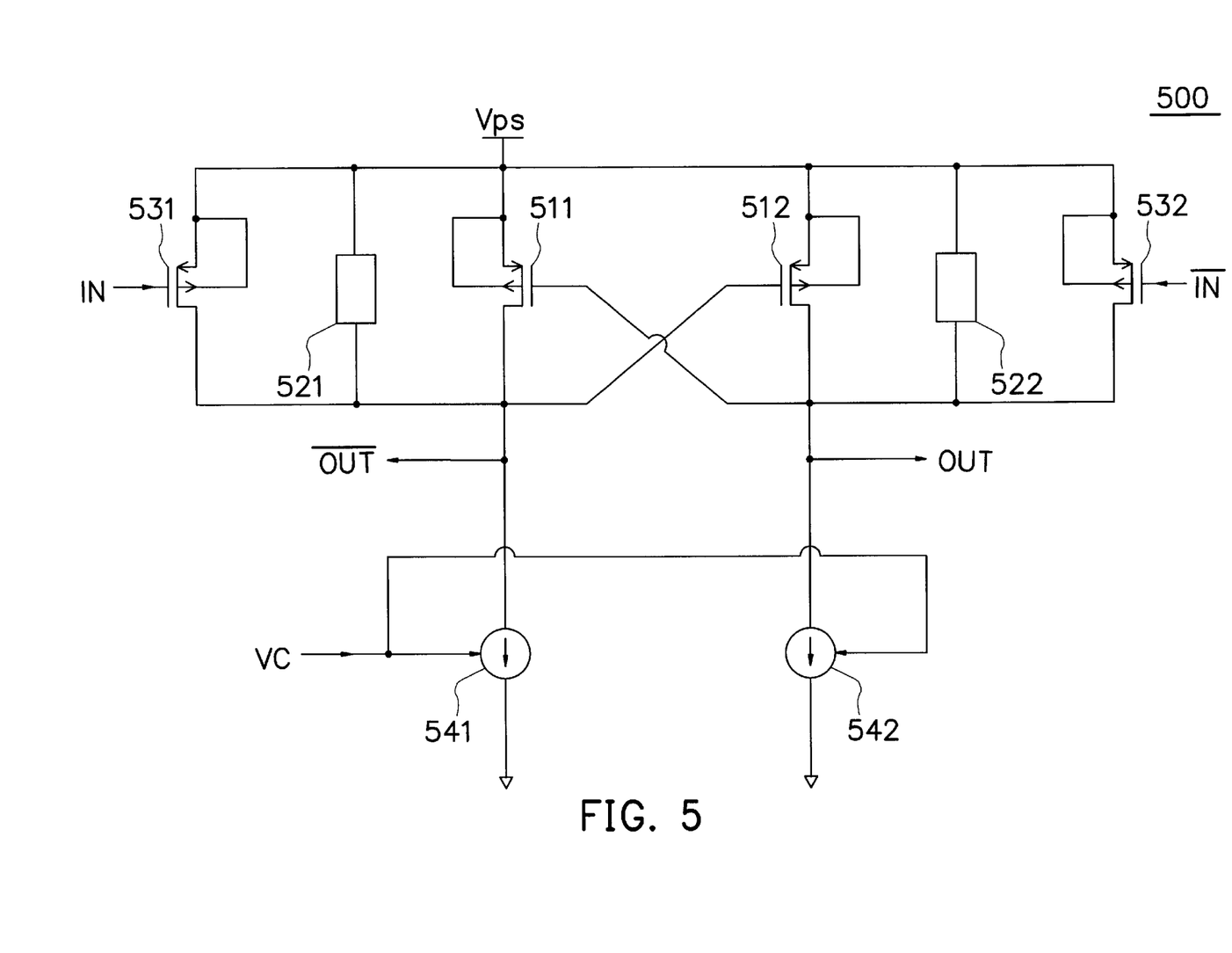
FIG. 5 is a circuit diagram illustrating a delay unit of FIG. 4.

FIG. 5 is a circuit diagram illustrating a delay unit of FIG. 4. Here, the delay unit is given a different reference number 500. The delay unit 500 includes MOS FETs 511, 512, 531 and 532, current sources 541 and 542, and load devices 521 and 522. MOS FETs 511, 512, 531 and 532 are P-type MOS FETs.

As shown in FIG. 5, MOS FETs 511 and 512 are electrically connected to each other to form a latch circuit. Both terminals of the load device 521 are electrically connected to the source and the drain of MOS FET 511 while both terminals of the load device 522 are electrically connected to the source and the drain of MOS FET 512.

The source and the drain of the MOS FET 531 are electrically connected to the source and the drain of the MOS FET 511. The gate of the MOS FET 531 serves as an input terminal IN. Similarly, the source and the drain of the MOS FET 532 are electrically connected to the source and the drain of the MOS FET 512. The gate of the MOS FET 532 serves as a complementary input terminal $\overline{\text{IN}}$.

An output terminal OUT is output from the drain of the MOS FET 512 while an complementary output terminal $\overline{\text{OUT}}$ is output from the drain of the MOS FET 511.

Furthermore, the current source 541 is electrically connected between the drain of the MOS FET 511 and ground while the current source 542 is electrically connected between the drain of the MOS FET 512 and the ground. The current sources 541 and 542 both are controlled by a control voltage VC to generate a current proportional to the control voltage VC. The signal delay of the delay unit 500 is completely controlled by the control voltage VC, thereby changing the frequency of an oscillating signal generated by a voltage controlled oscillator which is comprised of the delay units 500. There is one more advantage that the oscillating frequency of the voltage controlled oscillator is controlled only by the control voltage VC. That is, the oscillating frequency is determined only by the generated current, and independent of the power supply voltage. As long as MOS FETs serving as the current sources can operate within saturation region, i.e., a corresponding current is constant, the oscillating frequency is determined only by the control voltage VC, and independent of the power source Vps.

Figure 6:
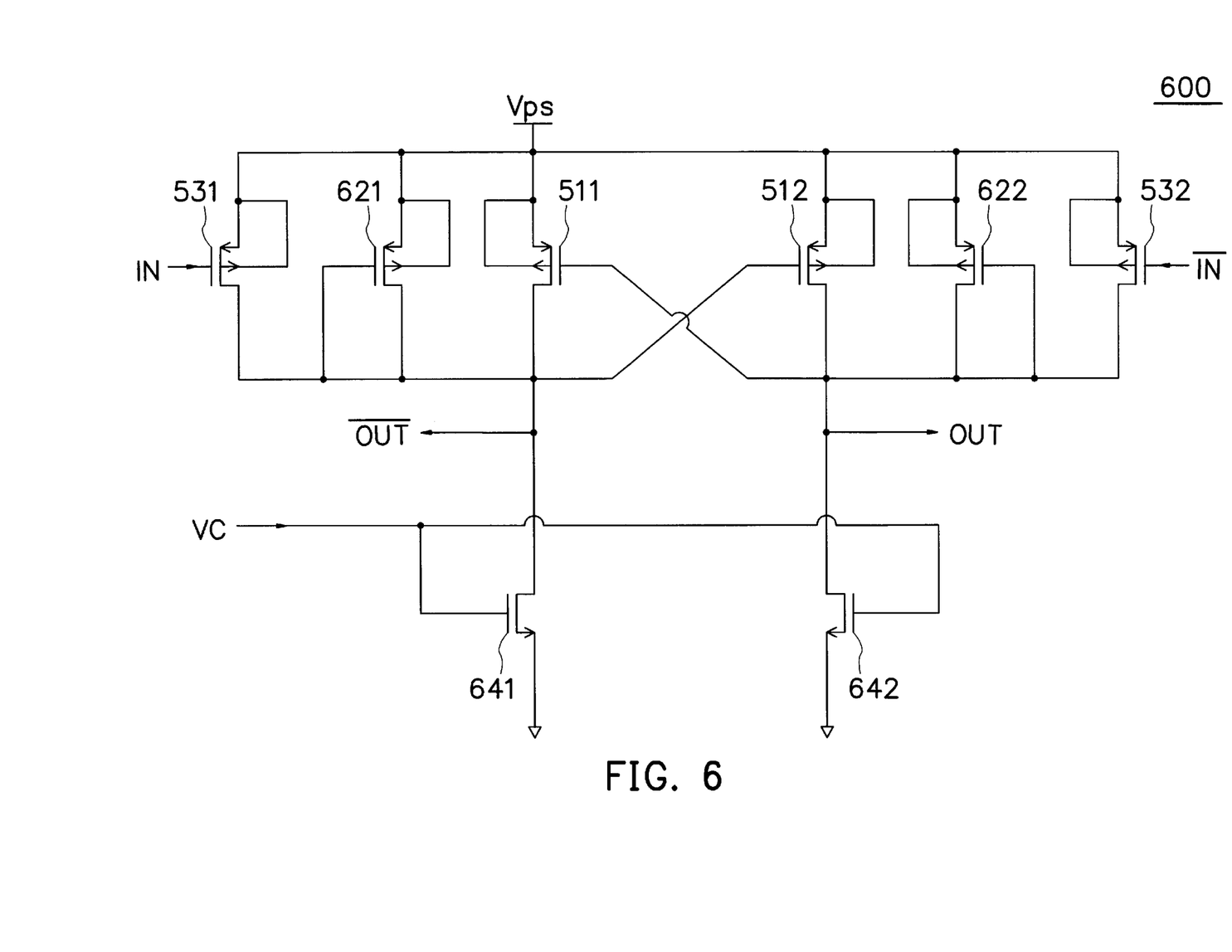
FIG. 6 is a detailed circuit diagram of FIG. 5.

In practical applications, the load devices 521, 522 and the current sources 541, 542 of the delay unit 500 can be MOS FETs. FIG. 6 is a detailed circuit diagram of a delay unit of FIG. 5. As can be seen from FIG. 6, except for the load devices 521, 522 and the current sources 541 and 542 being replaced with MOS FETs, other parts of the delay unit 600 are the same as those of the delay unit 500 designated with the same reference numbers.

Referring to FIG. 6, the gate of an MOS FET 621 is electrically connected to its own drain to form an active load device with the form of diode. The MOS FET 621 is used to replace the load device 521 which is electrically connected between the source and the drain of the MOS FET 511. Similarly, the gate of an MOS FET 622 is electrically connected to its own drain to form an active load device with the form of diode. The MOS FET 622 is used to replace the load device 522 which is electrically connected between the source and the drain of the MOS FET 512.

The MOS FET 641 functions as the current source 541. A control voltage VC is electrically connected to the gate of the MOS FET 641. The drain current of the MOS FET 641 is directly proportional to the square of the control voltage VC. Similarly, the MOS FET functions as the current source 542. The control voltage VC is also electrically connected to the gate of the MOS FET 642. The drain current of the MOS FET 642 is also directly proportional to the square of the control voltage VC. The signal delay of the delay unit 600 is completely controlled by the control voltage VC such that the frequency of an oscillating signal generated by a voltage controlled oscillator comprised of the delay units 600 can be changed.

Figure 7:
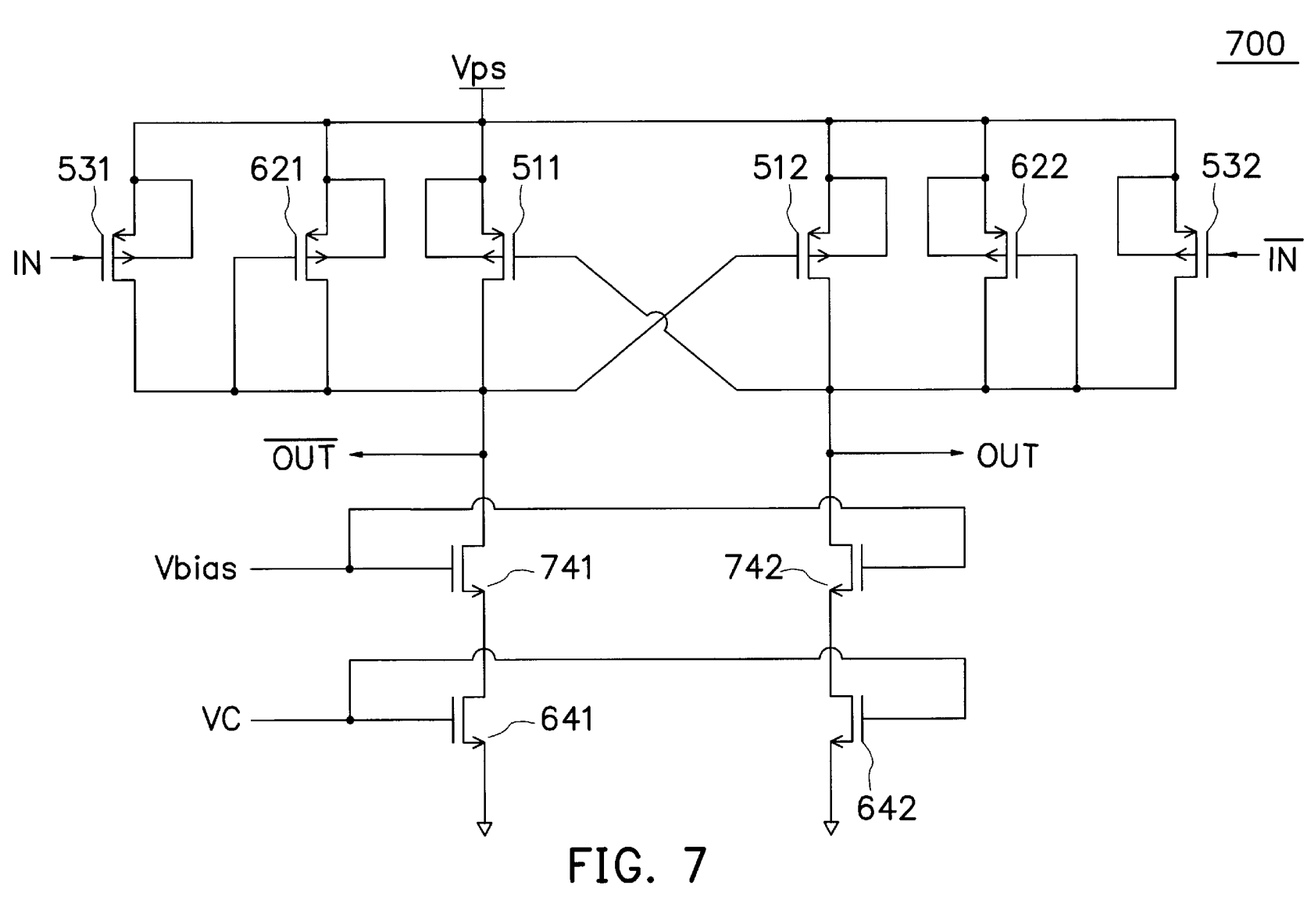
FIG. 7 is another detailed circuit diagram of FIG. 5.

FIG. 7 is another detailed circuit diagram of a delay unit of FIG. 5.

As shown in FIG. 7, to further improve the characteristics of each delay unit, two MOS FETs 741, 641 are electrically connected in cascade to form cascade current source to function as current source 541. Similarly, two MOS FETs 742, 642 are electrically connected in cascade to form cascade current source to function as current source 542. In addition, the gates of the MOS FETs 741, 742 are electrically connected to a fixed bias voltage Vbias. A control voltage VC is input to the gates of the MOS FETs 641, 642 to control the amplitude of the generated current. Since two MOS FETs electrically connected in series has a much higher output impedance, it can be considered as an ideal current source. Thus, a generated current can be more stable, resulting in a stable oscillation frequency which can not be easily affected by the variations of power source Vps and the control voltage VC.

In a voltage controlled oscillator according to the invention, each delay unit has a symmetric differential structure. The equivalent circuit of each delay unit is the same as that of FIG. 3. Therefore, not only the frequency of an oscillating signal generated can not be affected by the variation of a power source voltage, and has a low-jitter, but also the operating voltage of a power source is reduced to $V_t+2\Delta V$ because of only two FETs formed between the power source and ground.

With the same assumption stated previously, if $\Delta V$ is 0.3V and $V_t$ is 0.9V, the operating voltage can be reduced as low as 1.5V for normal operation. Therefore, a voltage controlled oscillator of the invention meets the requirement of low voltage operation.

As compared to the prior art, a voltage controlled oscillator of the invention has the following advantages:

(1) A symmetric differential structure is adopted to prevent the frequency of a generated oscillating signal from being affected by the variation of the power source.

(2) Delay units included in the voltage controlled oscillator can operate at a lower operating voltage without any effects to the performances thereof. Therefore, the voltage controlled oscillator meets the requirement of computers to operate at a lower voltage power source.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A low-voltage, low-jitter voltage controlled oscillator for receiving a control voltage and generating an output signal and a complementary output signal each with a frequency proportional to the control voltage, the voltage controlled oscillator comprising:

a first delay unit, a second delay unit and a third delay unit each having an input terminal, a complementary input terminal, an output terminal, a complementary output terminal and a voltage control terminal, the input terminal and the complementary input terminal of the first delay unit electrically connected to the complementary output terminal and the output terminal of the third delay unit, the input terminal and the complementary input terminal of the second delay unit electrically connected to the complementary output terminal and the output terminal of the first delay unit, the input terminal and the complementary input terminal of the third delay unit electrically connected to the complementary output terminal and the output terminal of the second delay unit, and the control voltage applied to the voltage control terminal of each delay unit to control the delay time between the input and the complementary input terminals, and the output and the complementary output terminals of each delay unit, wherein each delay unit comprises:

a first MOS FET of which the source is electrically connected to a power source;

a second MOS FET of which the source is electrically connected to the power source, the gate is electrically connected to the drain of the first MOS FET, and the drain is electrically connected to the gate of the first MOS FET;

a first load device, both terminals of which are electrically connected to the source and the drain of the first MOS FET, respectively;

a second load device, both terminals of which are electrically connected to the source and the drain of the second MOS FET, respectively;

a third MOS FET of which the source is electrically connected to the power source, the drain is electrically connected to the drain of the first MOS FET, and the gate serves as the input terminal of each delay unit;

a fourth MOS FET of which the source is electrically connected to the power source, the drain is electrically connected to the drain of the second MOS FET, and the gate serves as the complementary input terminal of the delay unit;

a first current source having a first terminal, a second terminal and a control terminal for generating a current proportional to the control voltage between the first terminal and the second terminal, the first terminal electrically connected to the drain of the first MOS FET, the second terminal electrically connected to ground, and the control terminal serving as the voltage control terminal for receiving the control voltage; and a second current source having a first terminal, a second terminal and a control terminal for generating a current proportional to the control voltage between the first terminal and the second terminal, the first terminal electrically connected to the drain of the second MOS FET, the second terminal electrically connected to ground, and the control terminal serving as the voltage control terminal for receiving the control voltage.

2. The low-voltage, low-jitter voltage controlled oscillator of claim 1, wherein the first load device is a MOS FET of which the gate is electrically connected to its own drain, the source is electrically connected to the power source, and the drain is electrically connected to the drain of the first MOS FET.

3. The low-voltage, low-jitter voltage controlled oscillator of claim 1, wherein the second load device is a MOS FET of which the gate is electrically connected to its own drain, the source is electrically connected to the power source, and the drain is electrically connected to the drain of the second MOS FET.

4. The low-voltage, low-jitter voltage controlled oscillator of claim 1, wherein the first current source is a MOS FET of which the gate serves as the control terminal, the drain is electrically connected to the drain of the first MOS FET, and the source is electrically connected to ground.

5. The low-voltage, low-jitter voltage controlled oscillator of claim 1, wherein the second current source is a MOS FET of which the gate serves as the control terminal, the drain is electrically connected to the drain of the second MOS FET, and the source is electrically connected to ground.

6. The low-voltage, low-jitter voltage controlled oscillator of claim 1, wherein the first current source comprises a fifth MOS FET and a sixth MOS FET, the fifth MOS FET having a drain electrically connected to the drain of the first MOS FET and a gate electrically connected to a fixed bias voltage, and the sixth MOS FET having a source electrically connected to ground, a drain electrically connected to the source of the fifth MOS FET and a gate serving as the control gate.

7. The low-voltage, low-jitter voltage controlled oscillator of claim 1, wherein the second current source comprises a seventh MOS FET and an eighth MOS FET, the seventh MOS FET having a drain electrically connected to the drain of the second MOS FET and a gate electrically connected to a fixed bias voltage, and the eighth MOS FET having a source electrically connected to ground, a drain electrically connected to the source of the seventh MOS FET and a gate serving as the control gate.

8. A low-voltage, low-jitter voltage controlled oscillator for receiving a control voltage and generating an output signal and a complementary output signal each with a frequency proportional to the control voltage, the voltage controlled oscillator comprising:

a first delay unit, a second delay unit and a third delay unit each having an input terminal, a complementary input terminal, an output terminal, a complementary output terminal and a voltage control terminal, the input terminal and the complementary input terminal of the first delay unit electrically connected to the complementary output terminal and the output terminal of the third delay unit, the input terminal and the complementary input terminal of the second delay unit electrically connected to the complementary output terminal and the output terminal of the first delay unit, the input terminal and the complementary input terminal of the third delay unit electrically connected to the complementary output terminal and the output terminal of the second delay unit, the output signal and the complementary output signal output from the output terminal and the complementary output terminal of the third delay unit, and the control voltage applied to the voltage control terminal of each delay unit to control the delay time between the input and complementary input terminals, and the output and complementary output terminals of each delay unit, wherein each delay unit comprises:

a first MOS FET of which the source is electrically connected to a power source;

a second MOS FET of which the source is electrically connected to the power source, the gate is electrically connected to the drain of the first MOS FET, and the drain is electrically connected to the gate of the MOS FET;

a third MOS FET of which the source is electrically connected to the power source, the drain is electrically connected to the drain of the first MOS FET, and the gate serves as the input terminal of each delay unit;

a fourth MOS FET of which the source is electrically connected to the power source, the drain is electrically connected to the drain of the second MOS FET, and the gate serves as the complementary input terminal of each delay unit;

a fifth MOS FET of which the gate is electrically connected to its own drain, the source is electrically connected to the power source, and the drain is electrically connected to the drain of the first MOS FET;

a sixth MOS FET of which the gate is electrically connected its own drain, the source is electrically connected to the power source, and the drain is electrically connected to the drain of the second MOS FET;

a seventh MOS FET of which the gate serves as the voltage control terminal, the drain is electrically connected to the drain of the first MOS FET, and the source is electrically connected to ground; and an eighth MOS FET of which the gate serves as the voltage control terminal, the drain is electrically connected to the drain of the second MOS FET, and the source is electrically connected to ground.

9. The low-voltage, low-jitter voltage controlled oscillator of claim 8, wherein the fifth MOS FET and the sixth MOS FET serve as active load devices.

10. The low-voltage, low-jitter voltage controlled oscillator of claim 9, wherein the seventh MOS FET and the eighth MOS FET serve as current sources.

11. A low-voltage, low-jitter voltage controlled oscillator for receiving a control voltage and generating an output signal and a complementary output signal each with a frequency proportional to the control voltage, the voltage controlled oscillator comprising:

a first delay unit, a second delay unit and a third delay unit each having an input terminal, a complementary input terminal, an output terminal, a complementary output terminal and a voltage control terminal, the input terminal and the complementary input terminal of the first delay unit electrically connected to the complementary output terminal and the output terminal of the third delay unit, the input terminal and the complementary input terminal of the second delay unit electrically connected to the complementary output terminal and the output terminal of the first delay unit, the input terminal and the complementary input terminal of the third delay unit electrically connected to the complementary output terminal and the output terminal of the second delay unit, the control voltage applied to the voltage control terminal of each delay unit to control a delay time between the input and complementary input terminals, and the output and the complementary output terminals of each delay unit, wherein each delay unit comprises:

a first MOS FET of which the source is electrically connected to a power source;

a second MOS FET of which the source is electrically connected to the power source, the gate is electrically connected to the drain of the first MOS FET, and the drain is electrically connected to the gate of the first MOS FET;

a third MOS FET of which the source is electrically connected to the power source, the drain is electrically connected to the drain of the first MOS FET, and the gate serves as the input terminal of each delay unit;

a fourth MOS FET of which the source is electrically connected to the power source, the drain is electrically connected to the drain of the second MOS FET, and the gate serves as the complementary input terminal of each delay unit;

a fifth MOS FET of which the gate is electrically connected to its own drain, the source is electrically connected to the power source, and the drain is electrically connected to the drain of the first MOS FET;

a sixth MOS FET of which the gate is electrically connected to its own drain, the source is electrically connected to the power source, and the drain is electrically connected to the drain of the second MOS FET;

a seventh MOS FET of which the gate is electrically connected to a fixed bias voltage, and the drain is electrically connected to the drain of the first MOS FET;

a eighth MOS FET of which the gate serves as the voltage control terminal, and the drain is electrically connected to the source of the seventh MOS FET, and the source is electrically connected to ground;

a ninth MOS FET of which the gate is electrically connected to a fixed bias voltage, and the drain is electrically connected to the drain of the second MOS FET; and a tenth MOS FET of which the gate serves as the voltage control terminal, the drain is electrically connected to the source of the ninth MOS FET, and the source is electrically connected to ground.

* * * * *